(12) United States Patent
Lin et al.

(10) Patent No.: US 11,251,165 B2
(45) Date of Patent: Feb. 15, 2022

(54) MULTICOLOR LIGHT ENGINE FOR A SEMICONDUCTOR LAMP

(71) Applicant: LEDVANCE GmbH, Garching bei Munchen (DE)

(72) Inventors: Jing Lin, Guangdong (CN); Junhao Yuan, Guangdong (CN); Xiongqiang He, Guangdong (CN); Shuting Chou, Guangdong (CN)

(73) Assignee: LEDVANCE GMBH, Garching Bei München (DE)

( * ) Notice: Subject to any disclaimer, the term of this patent is extended or adjusted under 35 U.S.C. 154(b) by 0 days.

(21) Appl. No.: 16/675,587

(22) Filed: Nov. 6, 2019

(65) Prior Publication Data

US 2020/0144230 A1 May 7, 2020

(30) Foreign Application Priority Data

Nov. 6, 2018 (CN) .......................... 201811311590.4

(51) Int. Cl.
| | |
|---|---|
| H01L 25/075 | (2006.01) |
| H01L 33/62 | (2010.01) |
| H01L 33/52 | (2010.01) |
| F21K 9/232 | (2016.01) |
| F21Y 107/90 | (2016.01) |
| F21Y 113/13 | (2016.01) |
| F21Y 105/16 | (2016.01) |
| F21Y 115/10 | (2016.01) |

(52) U.S. Cl.
CPC .......... *H01L 25/0753* (2013.01); *F21K 9/232* (2016.08); *H01L 33/52* (2013.01); *H01L 33/62* (2013.01); *F21Y 2105/16* (2016.08); *F21Y 2107/90* (2016.08); *F21Y 2113/13* (2016.08); *F21Y 2115/10* (2016.08)

(58) Field of Classification Search
None
See application file for complete search history.

(56) References Cited

U.S. PATENT DOCUMENTS

| 10,004,112 B2 | 6/2018 | Sugimoto | |
|---|---|---|---|
| 10,278,252 B2 | 4/2019 | Li et al. | |
| 10,683,990 B2 | 6/2020 | Dutta et al. | |
| 10,746,358 B1* | 8/2020 | Palfreyman | F21V 21/005 |
| 2005/0073840 A1* | 4/2005 | Chou | F21K 9/00 |
| | | | 362/238 |
| 2011/0163683 A1* | 7/2011 | Steele | F21K 9/64 |
| | | | 315/192 |
| 2011/0193105 A1* | 8/2011 | Lerman | H01L 33/08 |
| | | | 257/88 |

(Continued)

OTHER PUBLICATIONS

Protzman, B., "Color Tuning Makes LED Lighting More Like and Old Friend", LEDs Magazine Jun. 9, 2016. (Year: 2016).*

(Continued)

*Primary Examiner* — J. E. Schoenholtz
(74) *Attorney, Agent, or Firm* — Hayes Soloway PC

(57) ABSTRACT

A light engine for a semiconductor lamp comprises a substrate and at least two groups of LED chips arranged on the substrate. The LED chips of a first group are adapted to emit light having a first color and the LED chips of a second group are adapted to emit light having a second color different from the first color

16 Claims, 3 Drawing Sheets

(56) References Cited

U.S. PATENT DOCUMENTS

| | | | | |
|---|---|---|---|---|
| 2012/0320594 A1* | 12/2012 | Chien | ............... | F21V 3/00 |
| | | | | 362/249.03 |
| 2013/0058080 A1* | 3/2013 | Ge | ............... | F21V 19/005 |
| | | | | 362/231 |
| 2013/0223058 A1* | 8/2013 | Briggs | ............... | H05B 45/46 |
| | | | | 362/225 |
| 2013/0301257 A1* | 11/2013 | Britt | ............... | H01L 25/0753 |
| | | | | 362/231 |
| 2014/0209943 A1* | 7/2014 | Yamamoto | ............... | H01L 27/15 |
| | | | | 257/89 |
| 2015/0092404 A1* | 4/2015 | Kim | ............... | F21K 9/232 |
| | | | | 362/227 |
| 2015/0327343 A1* | 11/2015 | Dai | ............... | H05B 45/10 |
| | | | | 315/294 |
| 2015/0369431 A1* | 12/2015 | Li | ............... | F21K 9/232 |
| | | | | 362/249.1 |
| 2015/0380460 A1* | 12/2015 | Horie | ............... | H05B 45/20 |
| | | | | 257/89 |
| 2016/0057829 A1* | 2/2016 | Li | ............... | F21V 23/04 |
| | | | | 315/313 |
| 2016/0223146 A1* | 8/2016 | Vick | ............... | C09K 11/64 |
| 2018/0078072 A1* | 3/2018 | Loomis | ............... | F21V 23/06 |
| 2018/0328543 A1* | 11/2018 | Bergmann | ............... | H01L 25/0753 |
| 2019/0165229 A1* | 5/2019 | Randolph | ............... | H01L 33/644 |
| 2020/0168660 A1* | 5/2020 | Lee | ............... | H01L 33/502 |

OTHER PUBLICATIONS

Protzman, B., "Color Tuning Makes LED Lighting More Like an Old Friend", LEDs Magazine Jun. 9, 2016. (Year: 2016).*

* cited by examiner

MULTICOLOR LIGHT ENGINE FOR A SEMICONDUCTOR LAMP

CROSS-REFERENCE TO RELATED APPLICATIONS AND PRIORITY

This patent application claims priority from CN Patent Application No. 201811311590.4 filed Nov. 6, 2018, which is herein incorporated by reference in its entirety.

TECHNICAL FIELD

The present invention relates to a light engine for a semiconductor lamp.

BACKGROUND

A specific type of LED lamps uses LED filaments, i.e. strip-like LED elements which typically comprise a plurality of LED chips arranged in a row on a transparent strip-like carrier (e.g. glass or sapphire materials). The LED chips may be coated by a coating for converting the light generated by the LED chips into a desired wavelength range to obtain a desired color temperature. Multiple LED filaments are usually arranged inside a bulb of a lamp (e.g. a LED retrofit lamp having an Edison type lamp base, such as E27 or E14).

LED filaments generally are used in white light lamps. As LED filament lamps usually have a good omnidirectional light distribution, using LED filaments in RGB lamps (i.e., lamps allowing the setting of the color of the emitted light) such as OSRAM Lightify lamps would be desirable. However, using several LED filaments with different colors in a single lamp would require a complex holder in order to allow the filaments to be driven separately. Also, color mixing would be difficult due to the distance between the LED filaments. Furthermore, the resulting lamp would be rather heavy.

SUMMARY OF THE INVENTION

In view of the known prior art, it is an object of the present invention to provide a light engine based on LED filaments overcoming the disadvantages mentioned above.

This object is solved by a light engine according to the independent claim. Preferred embodiments are given by the dependent claims.

A light engine for a semiconductor lamp according to the present invention comprises a substrate and at least two groups of LED chips arranged on the substrate. The substrate may be a transparent strip-like carrier, for example made from glass or sapphire materials. The LED chips of each group are electrically connected to each other. The LED chips of a group can be connected in series. Alternatively, within a group, sets of two or more LED chips can be connected in parallel, with the sets being connected in series.

The substrate may have the form of an elongated strip having a longitudinal direction. "Longitudinal direction" here and in the following means the direction in which the substrate has its largest extension, also known as length. The other two perpendicular extensions are the width and the thickness of the substrate. The substrate may also have other forms than an elongated strip and may be at least partially polygonal or curved.

The LED chips of a first group are adapted to emit light having a first color and the LED chips of a second group are adapted to emit light having a second color different from the first color.

Putting LED chips emitting different colors on a single substrate results in a light-weight filament-type light engine that is easy to handle and to mount inside a lamp. Using an electronic driver adapted to drive the groups of LED chips individually in addition allows changing the color emitted by the light engine. As different colors are emitted in close proximity to each other, a good color mixing may be achieved.

The term "light engine" is used herein for the assembly comprising the LED chips and a mechanical structure holding the LED chips (i.e., the substrate) and including conductive traces and/or wires for supplying the LEDs with electric power from the driver or power supply.

In an embodiment, the light engine comprises at least three groups of LED chips arranged on the substrate (e.g., on an exterior surface thereof), wherein the LED chips of a first group are adapted to emit red light, the LED chips of a second group are adapted to emit green light, and the LED chips of a third group are adapted to emit blue light. Such an RGB (red/green/blue) light engine is able to emit a broad range of colors by mixing the light emitted by the at least three groups of LED chips.

The light engine may comprise more than three groups of LED chips, with two or more groups emitting the same color. Thus, brightness of the light emitted by the light engine may be varied over a larger range.

In an embodiment, the light engine comprises at least four groups of LED chips arranged on the substrate (e.g., on an exterior surface thereof), wherein the LED chips of a first group are adapted to emit red light, the LED chips of a second group are adapted to emit green light, the LED chips of a third group are adapted to emit blue light, and the LED chips of a fourth group are adapted to emit white light. Such an RGBW (red/green/blue/white) light engine is able to emit a broad range of colors by mixing the light emitted by the at least three groups of LED chips. At the same time, the white light LED chips allow to increase the brightness of the light emitted by the light engine.

The light engine may comprise more than four groups of LED chips, with two or more groups emitting the same color. Thus, brightness of the light emitted by the light engine may be varied over a larger range.

In an embodiment, the LED chips of at least one of the groups are arranged along a longitudinal direction of the substrate, for example along a straight line. In particular, the LED chips of each group may be arranged along a longitudinal direction of the substrate, such that each group forms a straight line of LED chips and the lines of LED chips are parallel to each other. Arranging the LED chips in this manner may allow using a substrate with small dimensions, while at the same time simplifying the electrical connection between the LED chips of each group, in particular when the LED chips of one or more of the groups are electrically connected in series with each other.

The electrical connection between the LED chips of each group may be achieved by a conductive track structure on the substrate. The conductive trace structure may be attached on the substrate (e.g., on an exterior surface thereof) by plating and/or etching. The LED chips may be attached to the conductive tracks of the conductive track structure for example by soldering, welding, or wire bonding. Alternatively, the LED chips may be connected directly to each other by bonding wires.

The light engine may also comprise connection terminals (electrodes) for connecting the light engine with the electronic driver or the power supply. The connection terminals may be fixed to the substrate and may be electrically connected to the conductive track structure mentioned above. In an embodiment, the light engine may comprise two connection terminals for each group of LEDs (for example 6 connections terminals for a RGB light engine or 8 connection terminals for a RGBW light engine). The electronic driver or the power supply may be electrically connected to the two connection terminals of each group of LED chips.

In particular, one of the connection terminals for each group may be fixed to the substrate on a first end of the substrate and the other of the connection terminals for each group may be fixed to the substrate on a second end of the substrate, opposite the first end. The two ends of the substrate, to which the connection terminals may be fixed, can be, for example, the two longitudinal ends of the substrate.

In another embodiment, the light engine may comprise one connection terminal for each group of LEDs and one common connection terminal for all groups of LEDs. For example, 4 connection terminals would be used for a RBG light engine and 5 connection terminals would be used for a RGBW light engine. The electronic driver or the power supply may be electrically connected to the one connection terminal of each group as well as to the common connection terminal (also called return terminal).

In an embodiment, all connection terminals may be fixed to the substrate on the same end of the substrate. Such a light engine can easily be mounted inside a lamp and connected to an electronic driver or power supply.

In an embodiment, the LED chips are covered by a protective coating. The coating may cover all LED chips of all groups or even cover the whole substrate. Alternatively, the coating may only cover one or more groups of LED chips. In particular, each group of LED chips may be covered by an individual coating.

A coating may be transparent and transmit the whole light emitted by the LED chips essentially undisturbed, thus providing only physical protection of the LED chips. A coating may also achieve a scattering or diffusive effect on the light emitted by the LED chips in order to improve light distribution (for example by including scattering particles or by having a diffusing surface). A coating may also include a color conversion material in order to change the color of the light at least partially. In particular, the LED chips of one of the groups can emit white light by initially emitting blue light and converting a portion of the blue light into yellow light by a phosphor coating, so that the resulting mixture of blue and yellow white appears as white light.

The LED chips may be arranged on one side or on both sides of the substrate. "Side(s)" herein means the surface(s) of the substrate having the largest area. If LED chips are arranged on both sides of the substrate, the LED chips on both sides may emit the same colors such that the same mixed light color can be emitted in all directions. Having LED chips on both sides of the substrate improves the omnidirectional emission of light from the light engine. If LED chips are arranged on only one side of the substrate, multiple light engines can be used to obtain an improved omnidirectional emission of light.

The light engines of the present invention may be considered as multicolor LED filaments. Production techniques known from prior art LED filaments may thus be used in producing the light engines of the present invention.

The present invention also relates to a lamp comprising at least one light engine as described above. The lamp may further comprise a base having electrical contacts and a translucent or transparent bulb. The lamp may also comprise an electronic driver, located for example at least partially in the base. The lamp may also comprise a holder for mechanically holding the at least one light engine. The holder may also include electrical connections from the electronic driver or from the electrical contacts to the at least one light engine.

BRIEF DESCRIPTION OF THE DRAWINGS

Preferred embodiments of the invention will be explained in the following, having regard to the drawings. It is shown in.

DETAILED DESCRIPTION OF THE INVENTION

In the following, preferred embodiments of the invention will be described with reference to the drawings. The same or similar elements or elements having the same effect may be indicated by the same reference number in multiple drawings. Repeating the description of such elements may be omitted in order to prevent redundant descriptions.

Figure 1:
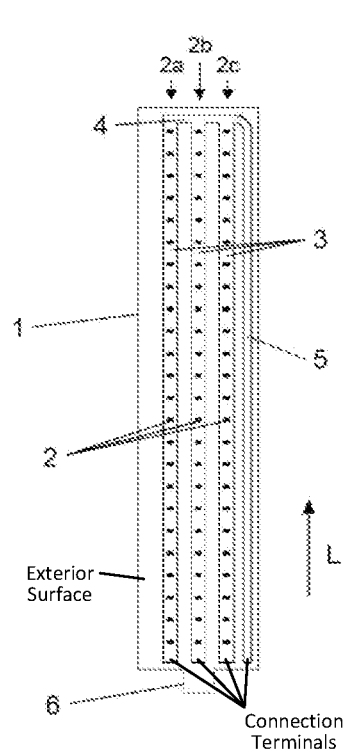
FIG. 1 a first embodiment of a light engine according to the present invention.

FIG. 1 shows a first embodiment of a light engine according to the present invention. The light engine comprises a substrate 1, for example made from a glass, sapphire, printed circuit board (PCB), or ceramic material. As an example, the length of the substrate 1 can be between approximately 30 mm and approximately 60 mm, in particular approximately 38 mm, and the width of the substrate 1 can be between approximately 6 mm and approximately 10 mm, in particular approximately 8 mm. The thickness of the substrate can be between approximately 1 mm and approximately 4 mm, in particular approximately 3 mm.

Three groups 2a, 2b, 2c of LED chips 2 are arranged on each side of substrate 1 (e.g., on an exterior surface of substrate 1). For the sake of simplicity, here and in the following, only the LED chips 2 and the conductive trace structure on one of the sides of the substrate are shown. Each group 2a, 2b, 2c comprises a plurality of LED chips 2 arranged along a longitudinal direction L of the substrate 1. The LED chips 2 of the first group 2a are adapted to emit red light, the LED chips 2 of the second group 2b are adapted to emit green light, and the LED chips 2 of the third group 2a are adapted to emit blue light. The size of the LED chips may be approximately 0.36 mm by 0.18 mm. The distance in the longitudinal direction L between two LED chips 2 may be between approximately 1 mm and approximately 2 mm, in particular approximately 1.6 mm. The distance perpendicular to the longitudinal direction L between two LED chips 2 may be between approximately 1 mm and approximately 2 mm, in particular approximately 1.8 mm.

Within each group 2a, 2b, 2c, the LED chips 2 are connected to each other in series by means of a conductive trace 3. At the upper end (as shown in the figures), the three conductive traces 3 are connected by a connecting conductive trace 4, which, in turn, is connected to a return conductive trace 5 running parallel to the three conductive traces 3 connecting the LED chips 2. The three conductive traces 3, the connecting conductive trace 4, and the return conductive trace 5 together form a conductive trace structure (e.g., arranged on an exterior surface of substrate 1). For the sake of simplicity, the conductive traces 3 are shown as continuous lines in FIGS. 1, 2 and 4. In reality, the conductive traces 3 contain gaps 14 that are bridged by the LED chips 2. These gaps 14 are shown in FIG. 3. The conductive trace structure may be made from a metal material such as copper or silver. In other embodiments, the LED chips can be connected to each other by bonding wires (e.g. gold bonding wires).

For the sake of simplicity, here and in the following, only the LED chips 2 and the conductive trace structure on one of the sides of the substrate are shown. A corresponding arrangement may be present on the opposite side.

At the lower end (as shown in the figures), the substrate 1 comprises a protrusion 6 that allows the mounting of the substrate 1 in a holder 7.

Figure 2:
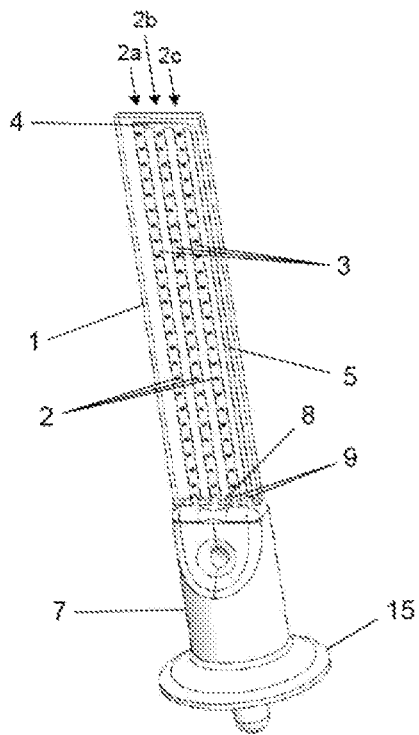
FIG. 2 the first embodiment of FIG. 1 with a holder.
Figure 3:
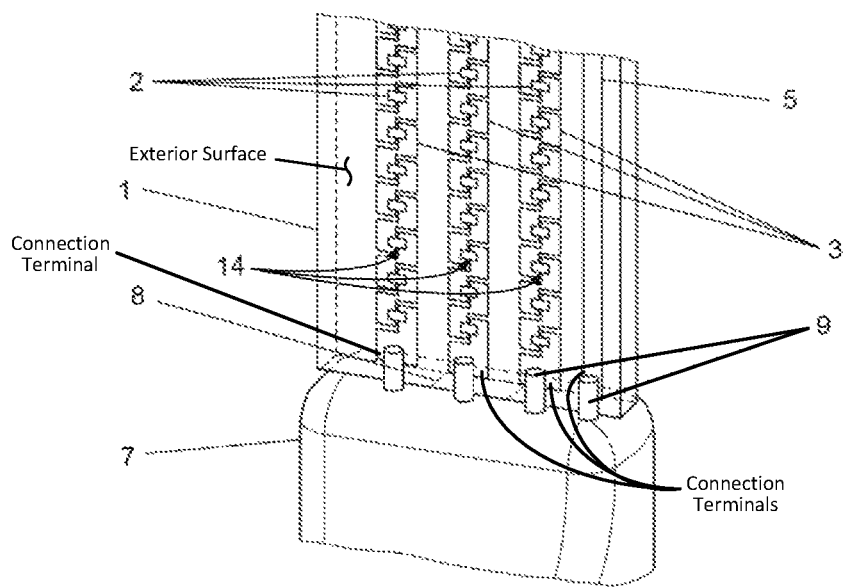
FIG. 3 an enlarged view of a portion of FIG. 2.

FIGS. 2 and 3 show the light engine of FIG. 1 mounted in a holder 7. The protrusion 6 of the substrate 1 is inserted into a slot 8 at the upper end (as shown in the figures) in the holder 7. Four electrodes 9 run through the holder 7 and extend from the holder next to the slot 8. Three of the electrodes 9 are electrically connected (for example by soldering or welding) to the conductive traces 3 connecting the LED chips 2, the fourth electrode 9 is electrically connected (for example by soldering or welding) to the return conductive trace 5. Connecting the electrodes 9 to the conductive traces 3, 5 also assists in mounting the substrate 1 to the holder 7. The electrodes 9 run through the holder 7 and exit the holder 7 at the lower end (not shown) where they can be connected to an electronic driver or to electrical contacts of a lamp base.

Figure 4:
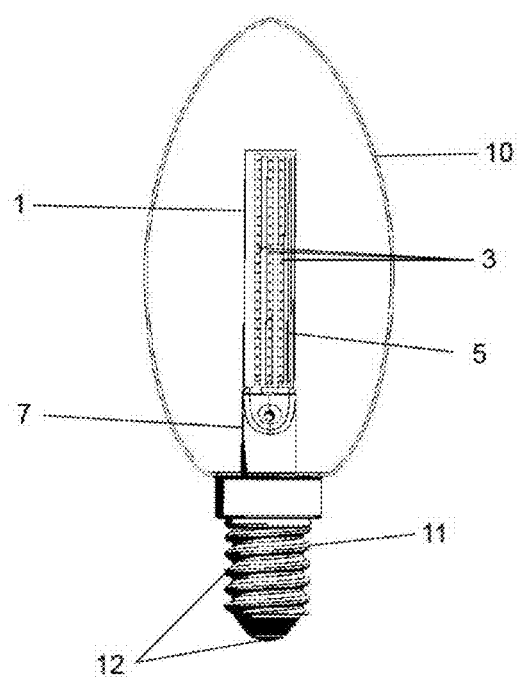
FIG. 4 a lamp comprising a light engine according to the first embodiment.

FIG. 4 shows a lamp comprising a light engine as explained above. The lamp comprises a translucent or transparent bulb 10 and a base 11, the base 11 having two electrical contacts 12. While FIG. 4 shows an Edison type base, any other base (e.g. bayonet type base, bi-pin base) may also be used. Also, the shape of the bulb may be different from the shape shown ion FIG. 4. The bulb 10 is closed at its lower end by a flange 15 of the holder 7 such that the light engine attached to the holder 7 is located inside the bulb 10. The bulb may be gas-tight and may be filled with a gas for heat dissipation of the heat generated by the light engine, in particular with a gas that has high thermal conductivity. The gas preferably contains helium and/or hydrogen. The gas can also be a gas mixture of various gases. Such a gas for heat dissipation may improve operation of the light engine inside a closed bulb without additional heat sinks.

Figure 5:
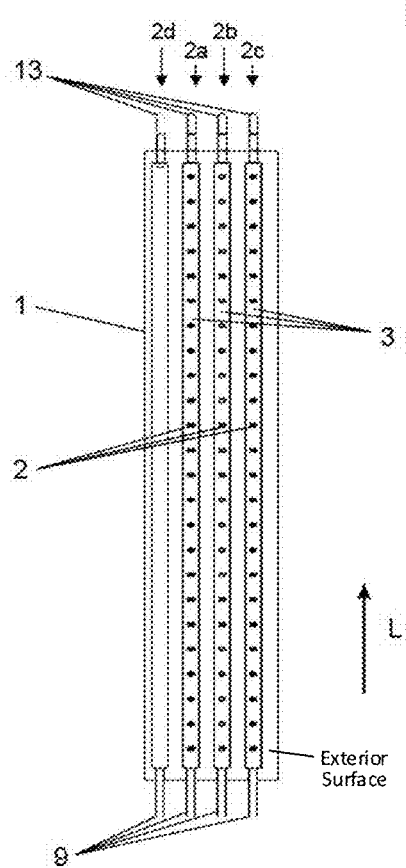
FIG. 5 a second embodiment of a light engine according to the present invention.

FIG. 5 shows a second embodiment of a light engine according to the present invention. The light engine comprises a substrate 1, for example made from a glass, sapphire, PCB, or ceramic material. As an example, the length of the substrate 1 can be between approximately 30 mm and approximately 60 mm, in particular approximately 38 mm, and the width of the substrate 1 can be between approximately 8 mm and approximately 12 mm, in particular approximately 10 mm. The thickness of the substrate can be between approximately 1 mm and approximately 4 mm, in particular approximately 3 mm.

Four groups 2a, 2b, 2c, 2d of LED chips 2 are arranged on one side of substrate 1 (e.g., on an exterior surface of substrate 1). Each group 2a, 2b, 2c, 2d comprises a plurality of LED chips 2 arranged along a longitudinal direction L of the substrate 1. The LED chips 2 of the first group 2a are adapted to emit red light, the LED chips 2 of the second group 2b are adapted to emit green light, and the LED chips 2 of the third group 2a are adapted to emit blue light. The LED chips of the fourth group 2d are adapted to emit blue light and are covered with a light conversion material (phosphor) converting some of the blue light into yellow light such that the mixture of the blue and yellow light emitted through the phosphor appears as white light. The individual LED chips of the fourth group 2d are not shown in FIGS. 5 to 7, since they are covered with the light conversion material. The size of the LED chips 2 may be approximately 0.36 mm by 0.18 mm. The distance in the longitudinal direction L between two LED chips 2 may be between approximately 1 mm and approximately 2 mm, in particular approximately 1.6 mm. The distance perpendicular to the longitudinal direction L between two LED chips 2 may be between approximately 1 mm and approximately 2 mm, in particular approximately 1.8 mm.

Within each group 2a, 2b, 2c, 2d, the LED chips 2 are connected to each other in series by means of a conductive trace 3. The four conductive traces 3 together form a conductive trace structure (e.g., arranged on an exterior surface of substrate 1). For the sake of simplicity, the conductive traces 3 are shown as continuous lines in FIGS. 5 to 7. In reality, the conductive traces 3 contain gaps 14 that are bridged by the LED chips 2 (similar to the gaps 14 shown in FIG. 3). The conductive trace structure may be made from a metal material such as copper or silver. In other embodiments, the LED chips can be connected to each other by bonding wires (e.g. gold bonding wires).

At both longitudinal ends of the substrate, an electrode 9, 13 is electrically connected (for example by soldering or welding) to each conductive trace 3 for connecting the light engine to an electronic driver or power supply.

Figure 6:
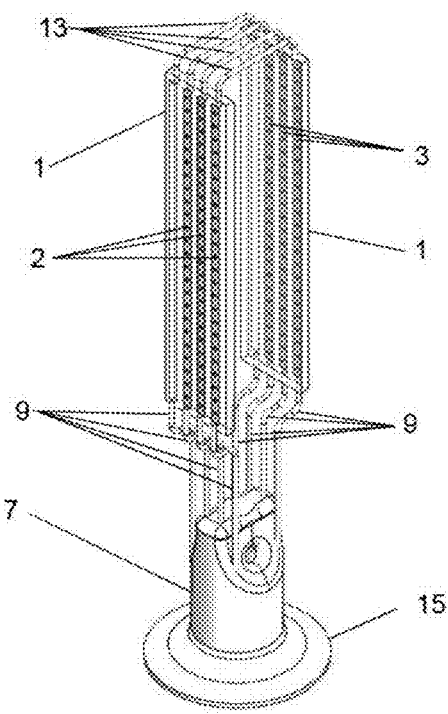
FIG. 6 two light engines according to FIG. 5 attached to a holder.

FIG. 6 shows two light engines according to FIG. 5 mounted to a holder 7. The holder 7 comprises two groups of four electrodes 9. The electrodes 9 of the first group are connected to the conductive traces 3 of the first light engine and the electrodes 9 of the second group are connected to the conductive traces 3 of the second light engine. Both light engines are connected at their upper longitudinal ends (as shown in FIG. 6) by connecting electrodes 13 such that the groups of LED chips 2 emitting the same color are connected to each other (i.e., red to red, green to green, blue to blue, white to white). Connecting the electrodes 9 to the conductive traces 3 mounts the substrates 1 to the holder 7. The electrodes 9 run through the holder 7 and exit the holder 7 at the lower end (not shown) where they can be connected to an electronic driver or to electrical contacts of a lamp base.

While FIG. 6 shows both light engines spaced apart from each other, they may also be mounted back to back.

Figure 7:
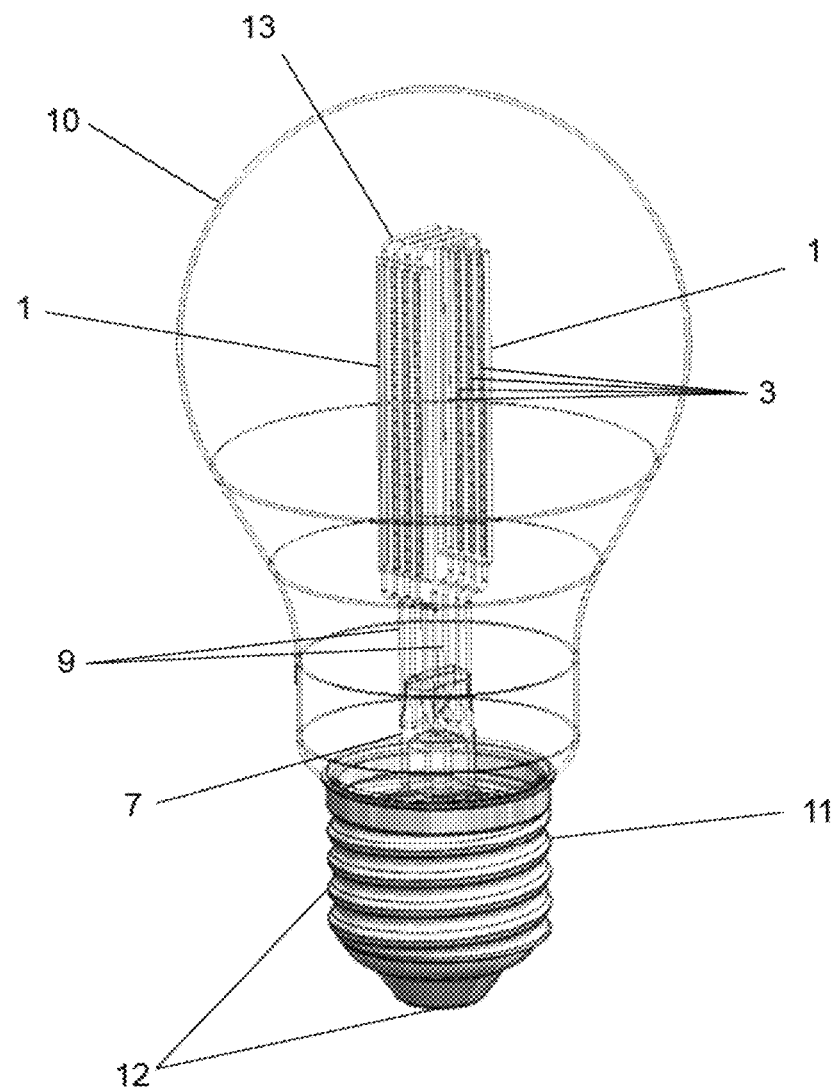
FIG. 7 a lamp comprising two light engines according to the second embodiment.

FIG. 7 shows a lamp comprising two light engines as explained above. The lamp comprises a translucent or transparent bulb 10 and a base 11, the base 11 having two electrical contacts 12. While FIG. 7 shows an Edison type base, any other base (e.g. bayonet type base, bi-pin base) may also be used. Also, the shape of the bulb may be different from the shape shown in FIG. 7. The bulb 10 is closed at its lower end by a flange 15 of the holder 7 such that the light engines attached to the holder 7 are located inside the bulb 10. The bulb may be gas-tight and may be filled with a gas for heat dissipation of the heat generated by the light engine, in particular with a gas that has high thermal conductivity. The gas preferably contains helium and/or hydrogen. The gas can also be a gas mixture of various gases. Such a gas for heat dissipation may improve operation of the light engine inside a closed bulb without additional heat sinks.

Although the invention has been illustrated and described in detail by the embodiments explained above, it is not limited to these embodiments. Other variations may be derived by the skilled person without leaving the scope of the attached claims.

Generally, "a" or "an" may be understood as singular or plural, in particular with the meaning "at least one", "one or more", etc., unless this is explicitly excluded, for example by the term "exactly one", etc.

In addition, numerical values may include the exact value as well as a usual tolerance interval, unless this is explicitly excluded.

Features shown in the embodiments, in particular in different embodiments, may be combined or substituted without leaving the scope of the invention.

LIST OF REFERENCE NUMERALS

1 Substrate
2 LED chips
2a, 2b, 2c, 2d Groups of LED chips
3 Conductive traces
4 Connecting conductive trace
5 Return conductive trace
6 Protrusion
7 Holder
8 Slot
9 Electrodes
10 Bulb
11 Base
12 Electrical contacts
13 Connecting electrodes
14 Gaps
15 Flange

The invention claimed is:

1. A semiconductor lamp comprising:
a base configured to make electrical contact for the semiconductor lamp;
a light-transmissive bulb;
a holder at least partially disposed within the bulb and connected with the base; and
at least one light engine comprising:
a substrate;
an electrically conductive trace structure arranged on an exterior surface of the substrate;
at least two groups of light-emitting diode (LED) chips arranged on the exterior surface of the substrate; and
two connection terminals for each group of LEDs, the two connection terminals being fixed to the substrate and electrically connected to the electrically conductive trace structure, wherein mounting the light engine to the holder within the semiconductor lamp provides electrical connection for the connection terminals;
wherein the LED chips of each group are electrically connected to each other by the electrically conductive trace structure; and
wherein the LED chips of a first group are adapted to emit light having a first color and the LED chips of a second group are adapted to emit light having a second color different from the first color;
wherein the holder mechanically holds the at least one light engine within the bulb and electrically connects the at least one light engine with the base;

wherein the holder comprises a plurality of electrodes that run through the holder and electrically connect the electrically conductive trace structure with the base; and
wherein the substrate includes a protrusion that is at least partially inserted into a corresponding slot provided in the holder.

2. The semiconductor lamp of claim 1, comprising at least three groups of LED chips arranged on the exterior surface of the substrate, wherein:
the LED chips of a first group are adapted to emit red light;
the LED chips of a second group are adapted to emit green light; and
the LED chips of a third group are adapted to emit blue light.

3. The semiconductor lamp of claim 1, comprising at least four groups of LED chips arranged on the exterior surface of the substrate, wherein:
the LED chips of a first group are adapted to emit red light;
the LED chips of a second group are adapted to emit green light;
the LED chips of a third group are adapted to emit blue light; and
the LED chips of a fourth group are adapted to emit white light.

4. The semiconductor lamp of claim 1, wherein the LED chips of at least one of the groups are electrically connected in series with each other by the electrically conductive trace structure.

5. The semiconductor lamp of claim 1, wherein:
one of the connection terminals for each group is fixed to the substrate on a first end of the substrate; and
the other of the connection terminals for each group is fixed to the substrate on a second end of the substrate, opposite the first end.

6. The semiconductor lamp of claim 1, wherein for each group of LEDs, one of the connectional terminals is configured as a common connection terminal for all groups of LEDs, the connection terminals being fixed to the substrate.

7. The semiconductor lamp of claim 6, wherein all connection terminals are fixed to the substrate on a same end of the substrate.

8. The semiconductor lamp of claim 1, wherein the LED chips are arranged on two opposing sides of the substrate.

9. The semiconductor lamp of claim 1, wherein the electrically conductive trace structure comprises:
a first electrically conductive trace by which the LED chips of the first group are electrically connected to each other; and
a second electrically conductive trace by which the LED chips of the second group are electrically connected to each other.

10. The semiconductor lamp of claim 9, wherein the first electrically conductive trace and the second electrically conductive trace run substantially parallel to one another along the substrate.

11. The semiconductor lamp of claim 9, wherein the electrically conductive trace structure further comprises a return electrically conductive trace electrically connected to both the first electrically conductive trace and the second electrically conductive trace.

12. The semiconductor lamp of claim 11, wherein the return electrically conductive trace:

runs substantially parallel to at least one of the first electrically conductive trace and the second electrically conductive trace along the substrate; and is continuous in form in that it has no physical gaps therein.

13. The semiconductor lamp of claim 1, wherein the electrically conductive trace structure includes physical gaps that are bridged by the LED chips.

14. The semiconductor lamp of claim 1, wherein within at least one of the groups of LED chips, sets of two or more LED chips are electrically connected in parallel with each other, with the sets being electrically connected in series with each other by the electrically conductive trace structure.

15. The semiconductor lamp of claim 1, wherein the substrate has at least one physical dimension in the range of about 30-60 mm and at least one other physical dimension in the range of about 6-10 mm.

16. The semiconductor lamp of claim 1, wherein the bulb is gas-tight and at least partially filled with a gas having a higher thermal conductivity than air.

* * * * *